United States Patent
Kim

(10) Patent No.: US 9,997,681 B2
(45) Date of Patent: Jun. 12, 2018

(54) LENS AND LIGHT EMITTING DIODE PACKAGE INCLUDING SAME

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/541,926

(22) PCT Filed: Jan. 15, 2016

(86) PCT No.: PCT/KR2016/000446
§ 371 (c)(1),
(2) Date: Jul. 6, 2017

(87) PCT Pub. No.: WO2016/126020
PCT Pub. Date: Aug. 11, 2016

(65) Prior Publication Data
US 2018/0006202 A1    Jan. 4, 2018

(30) Foreign Application Priority Data

Feb. 2, 2015   (KR) .......................... 10-2015-0015841

(51) Int. Cl.
*H01L 29/49*  (2006.01)
*H01L 33/58*  (2010.01)
(Continued)

(52) U.S. Cl.
CPC ............... *H01L 33/58* (2013.01); *G02B 3/02* (2013.01); *H01L 33/486* (2013.01); *H01L 33/62* (2013.01); *H01L 33/60* (2013.01)

(58) Field of Classification Search
CPC ........ H01L 33/58; H01L 33/486; H01L 33/60
See application file for complete search history.

(56) References Cited

U.S. PATENT DOCUMENTS

2008/0007966 A1   1/2008  Ohkawa
2009/0321767 A1*  12/2009  Shih .......................... F21V 5/04
                                                            257/98

(Continued)

FOREIGN PATENT DOCUMENTS

JP   2007-59073 A   3/2007
JP   2007-227410 A   9/2007

(Continued)

*Primary Examiner* — Michael Shingleton
(74) *Attorney, Agent, or Firm* — Birch, Stewart, Kolasch & Birch, LLP

(57) ABSTRACT

One embodiment relates to a lens comprising: a lower end portion having an incident surface to which light is incident; and an upper end portion having an emitting surface allowing the light having passed through the incident surface to pass therethrough, wherein the ratio of an incidence angle and an emission angle on a first plane and/or the ratio of an incidence angle and an emission angle on a second plane is smaller than the ratio of an incidence angle and an emission angle on a third plane, the incidence angle is an angle of the light incident to the incident surface with respect to a center axis, the emission angle is an angle of the light emitted from the emitting surface with respect to the center axis, each of the first to third planes is a plane passing the center axis and is parallel to a first direction, the first plane is perpendicular to the second plane, the third plane is positioned between the first plane and the second plane, the center axis passes the center of the lens and is parallel to the first direction, and the first direction is a direction facing the lower end portion from the upper end portion.

20 Claims, 10 Drawing Sheets

(51) Int. Cl.
*H01L 33/48* (2010.01)
*G02B 3/02* (2006.01)
*H01L 33/62* (2010.01)
*H01L 33/60* (2010.01)

(56) References Cited

U.S. PATENT DOCUMENTS

| | | | | |
|---|---|---|---|---|
| 2009/0323352 | A1* | 12/2009 | Shih | F21V 5/04 |
| | | | | 362/311.02 |
| 2012/0037793 | A1* | 2/2012 | Ong | G02B 3/02 |
| | | | | 250/216 |
| 2014/0204591 | A1 | 7/2014 | Kim et al. | |

FOREIGN PATENT DOCUMENTS

| | | |
|---|---|---|
| JP | 2014-48547 A | 3/2014 |
| KR | 10-2014-0094759 A | 7/2014 |
| KR | 10-2014-0097724 A | 8/2014 |

* cited by examiner

| | V (Deg) | | | α (Deg) | | | H (Deg) | | |
|---|---|---|---|---|---|---|---|---|---|
| ANGLE OF INCIDENCE | $\theta 1c=30$ | $\theta 1c=45$ | $\theta 1c=60$ | $\theta 2c=30$ | $\theta 2c=45$ | $\theta 2c=60$ | $\theta 3c=30$ | $\theta 3c=45$ | $\theta 3c=60$ |
| ANGLE OF EMISSION | $\theta 1o=27.60$ | $\theta 1o=37.17$ | $\theta 1o=32.80$ | $\theta 2o=26.79$ | $\theta 2o=41.54$ | $\theta 2o=41.54$ | $\theta 3o=26.99$ | $\theta 3o=38.11$ | $\theta 3o=36.06$ |
| RATIO OF ANGLE OF INCIDENCE AND ANGLE OF EMISSION | 0.92 | 0.83 | 0.55 | 0.89 | 0.92 | 0.69 | 0.90 | 0.85 | 0.60 |

|        |     | 1.0F  | 0.7F  | 0.5F  | 0.3F  | Center | 0.3F  | 0.5F  | 0.7F  | 1.0F  |
|--------|-----|-------|-------|-------|-------|--------|-------|-------|-------|-------|
| 1.0F   | Lux | 35.16 |       |       |       | 80.97  |       |       |       | 31.82 |
|        | %   | 40%   |       |       |       | 92%    |       |       |       | 36%   |
| 0.7F   | Lux |       | 72.30 |       |       | 83.19  |       |       | 74.12 |       |
|        | %   |       | 82%   |       |       | 95%    |       |       | 85%   |       |
| 0.5F   | Lux |       |       | 76.02 |       | 84.62  |       | 75.97 |       |       |
|        | %   |       |       | 87%   |       | 97%    |       | 87%   |       |       |
| 0.3F   | Lux |       |       |       | 83.88 | 86.82  | 83.10 |       |       |       |
|        | %   |       |       |       | 96%   | 99%    | 95%   |       |       |       |
| Center | Lux | 63.28 | 74.27 | 78.13 | 83.76 | 87.64  | 83.48 | 79.03 | 75.89 | 59.74 |
|        | %   | 72%   | 85%   | 89%   | 96%   | 100%   | 95%   | 90%   | 87%   | 68%   |
| 0.3F   | Lux |       |       |       | 82.21 | 85.80  | 82.55 |       |       |       |
|        | %   |       |       |       | 94%   | 98%    | 94%   |       |       |       |
| 0.5F   | Lux |       |       | 74.34 |       | 82.77  |       | 79.59 |       |       |
|        | %   |       |       | 85%   |       | 94%    |       | 91%   |       |       |
| 0.7F   | Lux |       | 69.97 |       |       | 80.82  |       |       | 69.95 |       |
|        | %   |       | 80%   |       |       | 92%    |       |       | 80%   |       |
| 1.0F   | Lux | 35.67 |       |       |       | 78.40  |       |       |       | 32.35 |
|        | %   | 41%   |       |       |       | 89%    |       |       |       | 37%   |

|  | ILLUMINANCE | UNIFORMITY |
|---|---|---|
| Center | 72.05 Lux | 100% |
| 1.0 Field (α) | 27.14 Lux | 38% |
| 1.0 Field (H) | 23.69 Lux | 33% |
| 1.0 Field (V) | 35.97 Lux | 50% |

|  | ILLUMINANCE | UNIFORMITY |
|---|---|---|
| Center | 108.82 Lux | 100% |
| 1.0 Field (α) | 40.31 Lux | 37% |
| 1.0 Field (H) | 67.41 Lux | 62% |
| 1.0 Field (V) | 95.27 Lux | 88% | ness
LENS AND LIGHT EMITTING DIODE PACKAGE INCLUDING SAME

CROSS REFERENCE TO RELATED APPLICATIONS

This application is the National Phase of PCT International Application No. PCT/KR2016/000446, filed on Jan. 15, 2016, which claims priority under 35 U.S.C. 119(a) to Patent Application No. 10-2015-0015841, filed in the Republic of Korea on Feb. 2, 2015, all of which are hereby expressly incorporated by reference into the present application.

TECHNICAL FIELD

Embodiments relate to a lens and a light-emitting device package including the same.

BACKGROUND ART

Light-emitting devices such as light-emitting diodes or laser diodes (LDs) using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting devices have advantages of low power consumption, a semi-permanent lifespan, fast response speed, good safety, and eco-friendly properties compared to existing light sources such as, for example, fluorescent lamps and incandescent lamps.

Light-emitting device packages have widely been used in lighting apparatuses or display apparatuses. A general light-emitting device package may include a body, lead frames located in the body, and a light-emitting device (e.g. an LED) located on any one of the lead frames.

In addition, the light-emitting device package may further include a lens, and the light-distribution pattern of the light-emitting device package may be determined according to the shape of the lens.

Technical Object

Embodiments provide a lens, which may mitigate a reduction in the illuminance of light emitted from the center thereof, but may increase the illuminance of light emitted to a third plane, and a light-emitting device package including the same.

Technical Solution

An embodiment provides a lens including a lower end portion having an incident surface on which light is incident and an upper end portion having an emitting surface through which the light that has passed through the incident surface passes, wherein at least one of a ratio of an angle of incidence and an angle of emission in a first plane and a ratio of an angle of incidence and an angle of emission in a second plane is smaller than a ratio of an angle of incidence and an angle of emission in a third plane, wherein the angle of incidence is an angle of light that is incident on the incident surface relative to a center axis, wherein the angle of emission is an angle of light that is emitted from the emitting surface relative to the center axis, and wherein each of the first to third planes is a plane that passes through the center axis and is parallel to a first direction, the first plane is perpendicular to the second plane, the third plane is located between the first plane and the second plane, the center axis passes through a center of the lens and is parallel to the first direction, and the first direction is a direction that faces the lower end portion from the upper end portion.

The angle of incidence in each of the first to third planes may be greater than 30 degrees and equal to or less than 60 degrees.

The angle of incidence in each of the first to third planes may be equal to or greater than 40 degrees and equal to or less than 60 degrees.

The lens may be horizontally symmetrical about the first plane.

The lens may be horizontally symmetrical about the second plane.

The lens may be horizontally symmetrical about the first plane and also horizontally symmetrical about the second plane.

The center axis may be an axis that passes through a center of the incident surface and a center of the emitting surface.

The first plane and the third plane may form an angle within a range from 30 degrees to 50 degrees therebetween.

Based on the same angle of incidence in the first to third planes, the ratio of the angle of incidence and the angle of emission in the third plane may be greater than the ratio of the angle of incidence and the angle of emission in the first plane and the ratio of the angle of incidence and the angle of emission in the second plane.

Another embodiment provides a lens including a lower end portion having an incident surface on which light is incident and an upper end portion having an emitting surface through which the light that has passed through the incident surface passes, wherein the lower end portion is convex in a first direction from a lower surface of the upper end portion and includes a recess indented in a center thereof in a direction opposite the first direction and a sidewall located to surround the recess, and the incident surface includes a lower surface of the recess, wherein, based on the same angle of incidence in first to third planes, at least one of a ratio of an angle of incidence and an angle of emission in the first plane and a ratio of an angle of incidence and an angle of emission in the second plane is smaller than a ratio of an angle of incidence and an angle of emission in the third plane, wherein the angle of incidence is an angle of light that is incident on the incident surface relative to a center axis, and the angle of emission is an angle of light that is emitted from the emitting surface relative to the center axis, and wherein, in a xyz coordinate system, the center axis corresponds to a z-axis, the first plane corresponds to an xz plane, the second plane corresponds to an yz plane, the third plane is located between the first plane and the second plane and is parallel to the first and second planes, and the first direction is a direction that faces the lower end portion from the upper end portion.

The lower surface of the recess may be a curved surface that is convex in the first direction.

The lower end portion may have a lowermost end located lower than a center of the incident surface.

The emitting surface may include an upper surface of the upper end portion, and the upper surface of the upper end portion may include a first portion corresponding to the incident surface and a second portion located around the first portion so as to correspond to the sidewall.

A distance from a center of the emitting surface to a center of the incident surface may be shorter than a distance from the center of the emitting surface to a lowermost end of the sidewall.

The first portion may be convex in a direction opposite the first direction.

The second portion may be an inclined surface tilted downward from an edge of the upper end portion toward a center of the upper end portion.

The upper end portion may have a protruding portion configured to protrude in a second direction from a side surface of the lower end portion, and the second direction may be perpendicular to the first direction.

The first plane and the third plane may form an angle within a range from 30 degrees to 50 degrees therebetween.

The first portion may have a center aligned with a center of the incident surface.

A further embodiment provides a light-emitting device package including a package body, first and second conductive layers disposed on the package body, a light-emitting device electrically connected to the first and second conductive layers, and the lens according to the above-described embodiment that is disposed on the package body and configured to refract light generated from the light-emitting device.

Advantageous Effects

Embodiments may mitigate a reduction in the illuminance of light emitted from the center of a lens and may increase the illuminance of light emitted to a third plane.

DESCRIPTION OF DRAWINGS

FIG. 4b illustrates a cross-sectional view taken along a first plane of the lens illustrated in FIG. 4a.

FIG. 4c illustrates the first plane, a second plane, and a third plane with respect to the lens illustrated in FIG. 4a.

MODE FOR INVENTION

Hereinafter, embodiments will be described in detail with reference to the accompanying drawings, in order to concretely realize the above object. In the description of the embodiments disclosed here, it will be understood that, when an element is referred to as being formed "on" or "under" another element, it can be directly "on" or "under" the other element or be indirectly formed with intervening one or more elements therebetween. It will also be understood that "on" or "under" the element may be described relative to the drawings.

Figure 1:
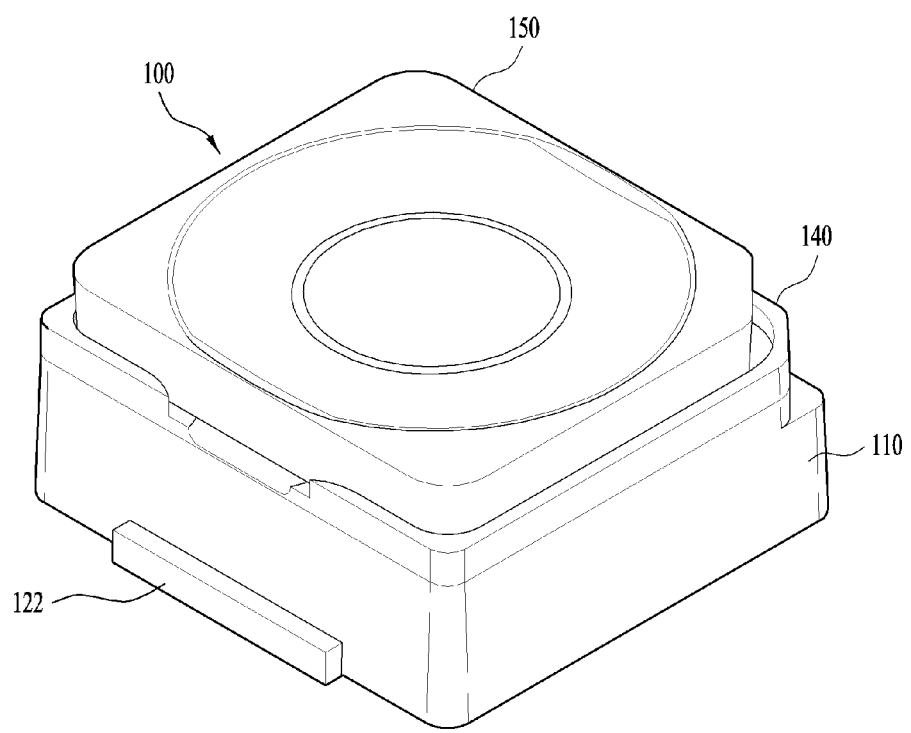
FIG. 1 illustrates a perspective view of a light-emitting device package according to an embodiment.
Figure 2:
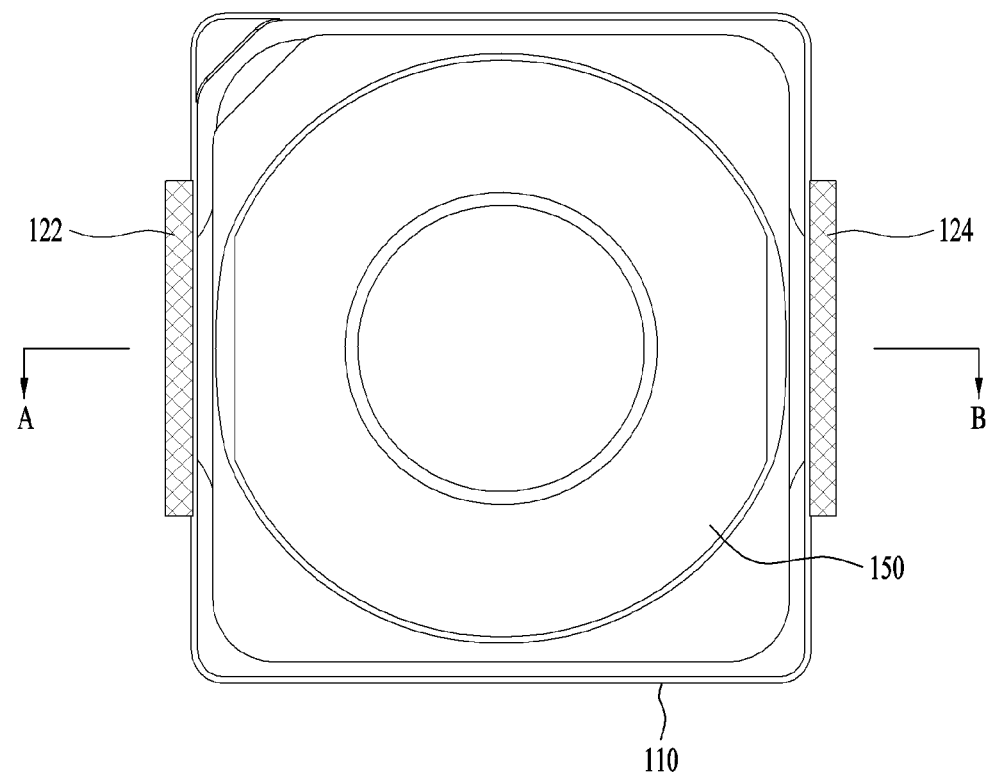
FIG. 2 illustrates a plan view of the light-emitting device package illustrated in FIG. 1.
Figure 3:
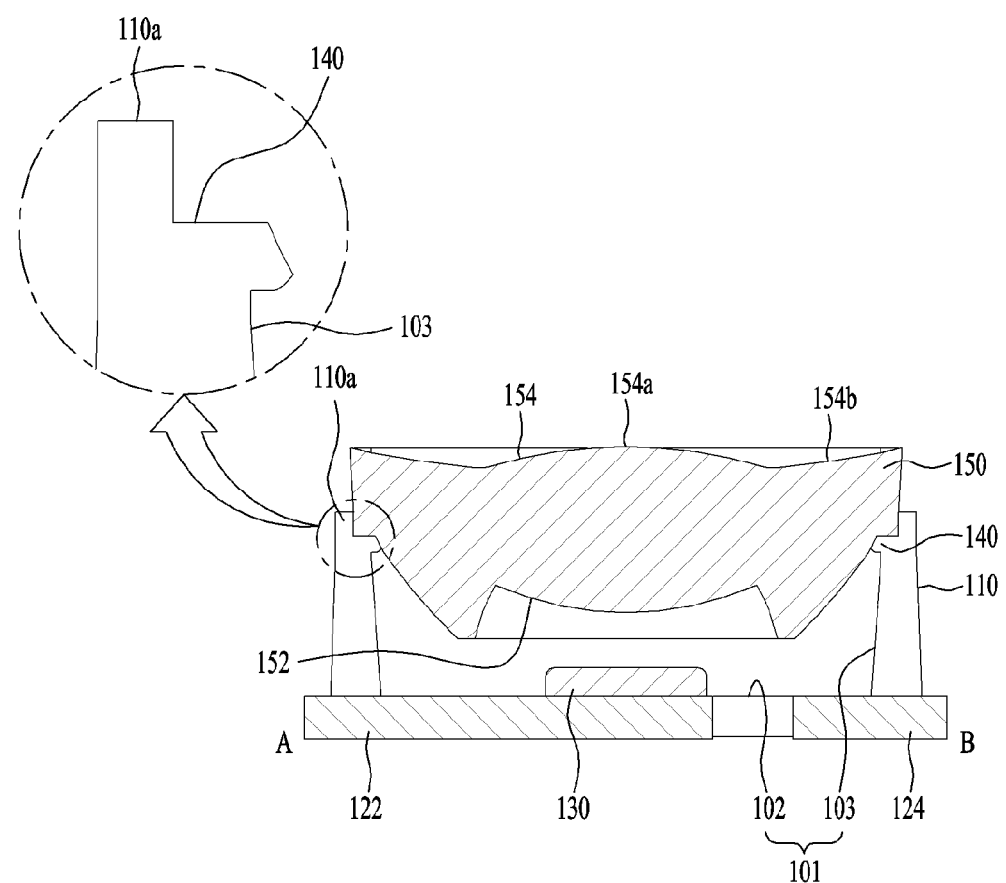
FIG. 3 illustrates a cross-sectional view taken along direction AB of the light-emitting device package illustrated in FIG. 2.

FIG. 1 illustrates a perspective view of a light-emitting device package 100 according to an embodiment, FIG. 2 illustrates a plan view of the light-emitting device package 100 illustrated in FIG. 1, and FIG. 3 illustrates a cross-sectional view taken along direction AB of the light-emitting device package 100 illustrated in FIG. 2.

Referring to FIGS. 1 to 3, the light-emitting device package 100 includes a package body 110, a first conductive layer 122, a second conductive layer 124, a light-emitting device 130, and a lens 150.

The package body 110 supports the first conductive layer 122, the second conductive layer 124, the light-emitting device 130, and the lens 150.

The package body 110 may be formed of a resin material having high light reflectance, for example, polyphthalamide (PPA), EMC resin, PC resin, or PCT resin. However, the embodiment is not limited to the material, structure, or shape of the body described above.

Alternatively, in another embodiment, the package body 110 may be formed of a substrate having good insulation or thermal conductivity such as, for example, a silicon-based wafer level package, a silicon substrate, or a silicon carbide (SiC), aluminum nitride (AlN), $Al_2O_3$, GaN, ZnO, $SiO_2$, Au, $Si_3N_4$, or AuSn substrate, and may take the form of a stack of multiple substrates.

Alternatively, in a further embodiment, the package body 110 may be formed of a material that absorbs light or has low light reflectance, for example, black resin, in order to increase the contrast between the turned-on and turned-off states of the light-emitting device 130, and may be formed via injection molding. For example, the package body 110 may be formed of polyphthalamide (PPA) resin having carbon black mixed therein, black epoxy mold compound (EMC) resin, or black silicon.

The package body 110 may have a cavity defined by a bottom 102 and a side surface 103. The top of the cavity may be open at the upper surface of the package body 110.

The cross-section of the cavity 101 of the package body 110 may have a cup shape or a concave container shape, for example, and the side surface 103 of the cavity 101 may be tilted relative to the bottom 102 of the cavity 101.

The shape of the cavity 101 of the package body 110 may have a circular shape, an oval shape, or a polygonal shape (e.g. a square shape) when viewed from the top side, and the corner portion of the cavity 101 of the package body 110, having a polygonal shape, may be a curved surface, without being limited thereto.

The first conductive layer 122 and the second conductive layer 124 are disposed on the package body 110 so as to be electrically separated from each other. The first and second conductive layers 122 and 124 may also be described using the terms "first and second lead frames".

The first conductive layer 122 and the second conductive layer 124 may be formed of a conductive material, for example, at least one of titanium (Ti), copper (Cu), nickel (Ni), gold (Au), chrome (Cr), aluminum (Al), tantalum (Ta), platinum (Pt), tin (Sn), silver (Ag), and phosphorus (P) or an alloy including at least one of them, and may have a single-layer structure or a multi-layered structure.

The surfaces, for example, the upper surfaces of the first and second conductive layers 122 and 124, may be coated with a reflective material that may reflect light emitted from the light-emitting device 130, for example, Ag.

One end of the respective first and second conductive layers 122 and 124 may be exposed out of the package body 110. For example, one end of the first conductive layer 122 may be exposed from a first side surface of the package body 110 and one end of the second conductive layer 124 may be exposed from a second side surface of the package body 110. The first side surface and the second side surface of the package body 110 may be surfaces that face each other, without being limited thereto.

A portion of the package body 110 may be disposed between the first conductive layer 122 and the second conductive layer 124. For example, the bottom 102 of the package body 110 may be disposed between the first conductive layer 122 and the second conductive layer 124.

The upper surfaces of the first and second conductive layers 122 and 124 may be exposed by the cavity 101. In addition, one end of the respective first and second conductive layers 122 and 124 may be exposed from the side surface and/or the lower surface of the package body 110.

The light-emitting device 130 is disposed inside the cavity 101 of the package body 110, and is electrically connected to the first and second conductive layers 122 and 124 so as to generate light.

The light-emitting device 130 may be disposed on the upper surface of the first conductive layer 122, which is exposed by the cavity 101.

For example, the light-emitting device 130 may be a light-emitting diode (LED), and may be electrically connected to the first and second conductive layers 122 and 124 via die bonding or wire bonding.

The lens 150 is disposed on the package body 110 and refracts light generated from the light-emitting device 130. For example, the lens 150 may be disposed on the upper surface of the package body 110, and the lower surface of the lens 150 may be in contact with the upper surface of the package body 110.

The package body 110 may have a protrusion 140, which protrudes from the side surface 103 of the cavity 101 of the horizontal direction. For example, the horizontal direction may be the direction that faces the center of the cavity 101 from the side surface 103 of the cavity 101.

The protrusion 140 of the package body 110 may have the shape of a ring that is formed along the side surface 103 of the cavity 101, and may be spaced apart from the uppermost end of the side surface 103 of the cavity 101.

The edge of the lens 150 may be disposed on the protrusion 140. The edge of the lens 150 may be supported by the protrusion 140.

The lens 150 disposed on the protrusion 140 may be spaced apart from the light-emitting device 130. The lens 130 may be formed of a transmissive resin material or a glass material, without being limited thereto.

The space between the light-emitting device 130 inside the cavity 101 of the package body 110 and an incident surface 152 of the lens 150 may be filled with air, without being limited thereto. The space in the cavity 101 below the incident surface 152 of the lens 150 may be filled with a material having a predetermined index of refraction, for example, a resin. Here, the resin to be charged therein may be brought into contact with the incident surface and/or the emitting surface of the lens 150.

The lens 150 may include the incident surface 152, on which light is incident, and the emitting surface. 154, through which the light that has passed through the incident surface 152 passes.

Figure 4A:
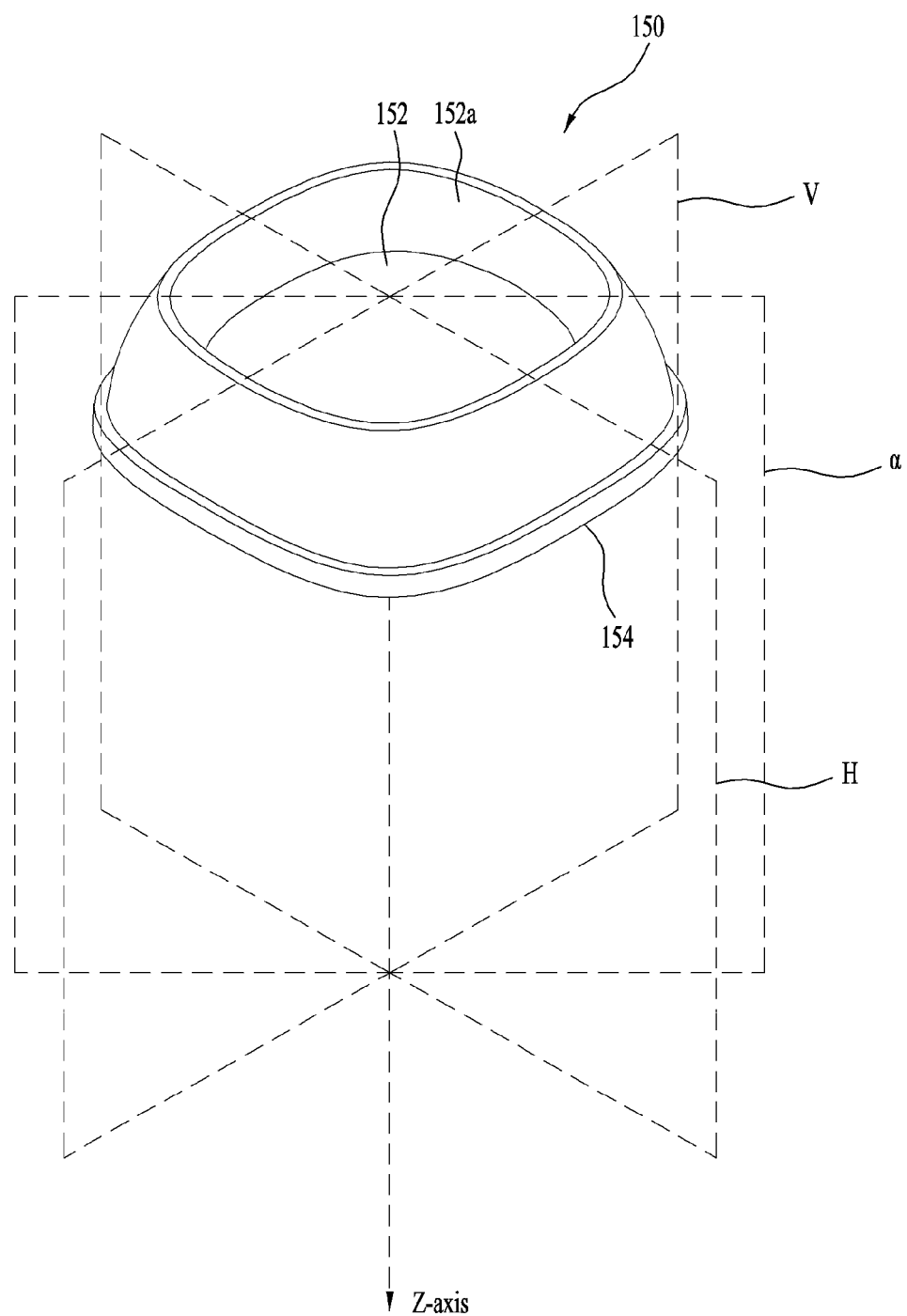
FIG. 4a illustrates a perspective view of a lens illustrated in FIG. 1.
Figure 4B:
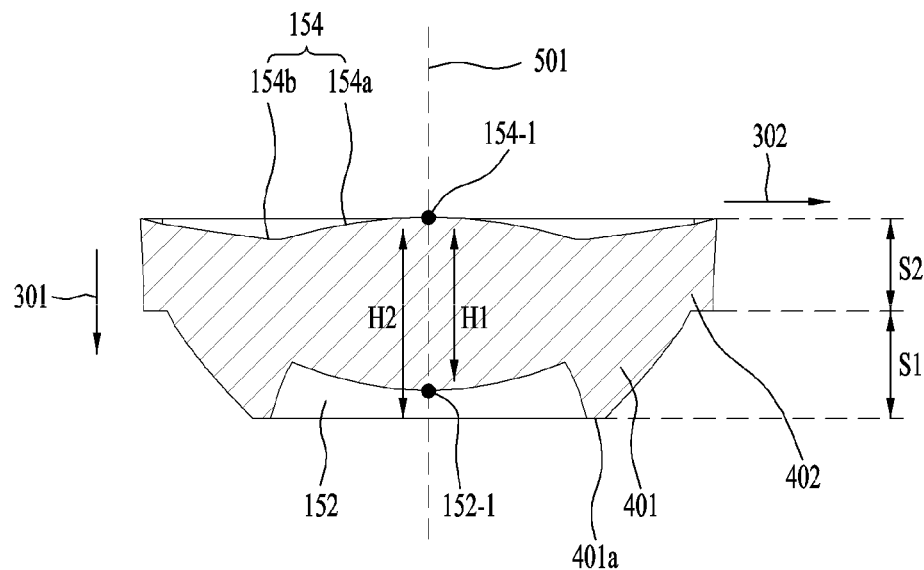
Figure 4C:
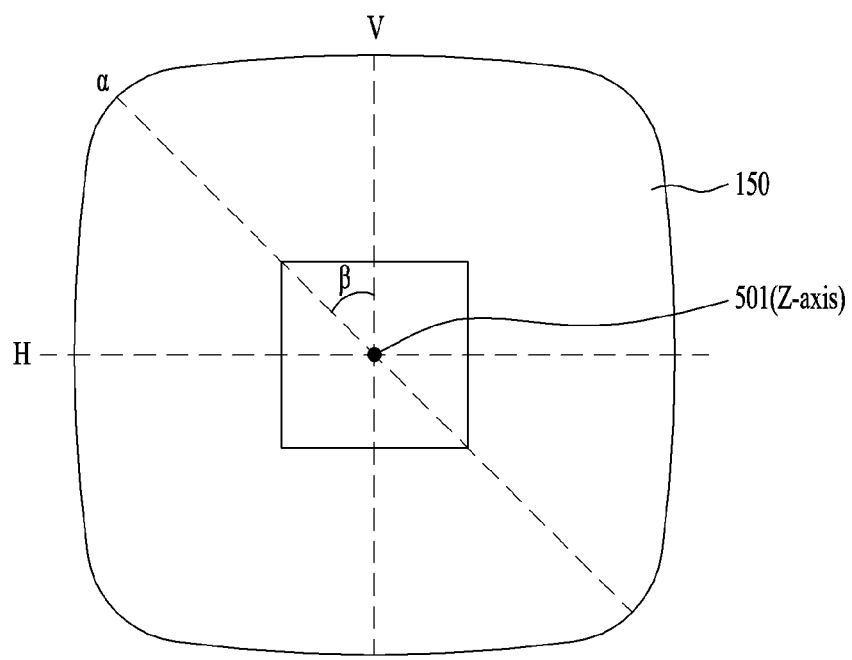

FIG. 4a illustrates a perspective view of the lens 150 illustrated in FIG. 1, FIG. 4b illustrates a cross-sectional view taken along a first plane V of the lens 150 illustrated in FIG. 4a, and FIG. 4c illustrates the first plane V, a second plane H, and a third plane α with respect to the lens 150 illustrated in FIG. 4a. FIGS. 4a and 4b illustrate that the lens 150 illustrated in FIG. 1 is rotated 180 degrees.

Referring to FIGS. 4a and 4b, the lens 150 includes a lower end portion S1 having the incident surface 152 and an upper end portion S2 located on the lower end portion S1 and having the emitting surface 154.

The lower end portion S1 and the upper end portion S2 of the lens 150 may be in contact with each other, and the upper end portion S2 and the lower end portion S1 may be integrally formed with each other.

For example, the lower end portion S1 of the lens 150 may include the incident surface 152, which is convex in a first direction 301, and a sidewall 401, which surrounds the incident surface 152 and protrudes in the first direction 301 from the incident surface 152. For example, the first direction 301 may be the direction that faces the incident surface 152 of the lower end portion S1 from the emitting surface 154 of the upper end portion S2.

In another embodiment, the incident surface 152 of the lower end portion S1 of the lens 150 may be concave in the first direction 201, or may include both concave and convex portions.

The lower end portion S1 of the lens 150 may have a recess 153, which is defined by the incident surface 152 and an inner surface 152a of the sidewall 401 and is indented in the direction opposite the first direction 301.

For example, light emitted from the light-emitting device 130 may be incident on the incident surface 152 and the inner surface 152a of the sidewall 401. As illustrated in FIG. 4a, the sidewall 401 may have a circular shape, an oval shape, or a polygonal shape including a square shape, without being limited thereto.

For example, the lower end portion S1 of the lens 150 may have a dome shape that is convex in the first direction from the lower surface of the upper end portion S2 of the lens 150, and may include the recess 153 indented in the center thereof in the direction opposite the first direction 301 and the sidewall 401 located to surround the recess 153.

The recess 153 of the lens 150 may include a lower surface and a side surface, and the lower surface of the recess 153 may be a curved surface that is convex in the first direction 301, without being limited thereto.

The incident surface of the lens 150 may include the lower surface of the recess 153. In addition, the incident surface of the lens 150 may include the lower surface and the side surface of the recess 153.

The side surface of the recess 153 of the lens 150 or the inner surface of the sidewall 401 may be an inclined surface. For example, the diameter of the recess 153 of the lens 150 may be reduced in the first direction 301.

As illustrated in FIG. 3, the lower end portion S1 of the lens 150 may be located inside the cavity 101 of the package body 110. For example, the incident surface 152 and the sidewall 401 of the lower end portion S1 of the lens 150 may be located inside the cavity 101 of the package body 110.

As illustrated in FIG. 4b, the lowermost end 401a of the sidewall 401 of the lower end portion S1 of the lens 150 may be located lower than the center 152-1 of the incident surface 152 of the lens 150.

For example, the distance H1 from the center 154-1 of the emitting surface 154 of the lens 150 to the center 152-1 of the incident surface 152 of the lens 150 may be shorter than the distance H2 from the center 154-1 of the emitting surface 154 of the lens 150 to the lowermost end 401a of the sidewall 401 of the lens 150 (H1<H2).

The upper end portion S2 of the lens 150 may include the emitting surface 154 through which the light that has passed through the incident surface 152 passes, and a protruding portion 402, which protrudes in a second direction 302.

The emitting surface 154 of the lens 150 may be convex or concave in the first direction 301, or may include both convex and concave portions.

For example, the emitting surface 154 of the lens 150 may include the upper surface of the upper end portion S2. In addition, for example, the upper surface of the upper end portion S2 may include a first portion 154a, which is centrally located and corresponds to the incident surface 152 in the first direction 301, and a second portion 154b, which is located around the first portion 154a so as to surround the first portion 154a.

The center of the first portion 154a may be aligned with the center of the incident surface 152 in the first direction 301.

The second portion 154b of the upper surface of the upper end portion S2 may correspond to the sidewall 401 of the lower end portion S1, or may overlap the sidewall 401 of the lower end portion S1 in the first direction.

The first portion 154a may be convex in the direction opposite the first direction, without being limited thereto, and the second portion 154b may be an inclined surface that is tilted downward from the edge 401b of the upper end portion S2 of the lens 150 toward the center of the upper end portion S2.

The protruding portion 402 of the lens 150 may protrude in the second direction 302 from the side surface of the lower end portion S1 or the outer circumferential surface of the sidewall 401 of the lower end portion S1. The second direction 302 may be perpendicular to the first direction 301. For example, the second direction 302 may be the direction that faces toward the outer circumferential surface of the lens 150 from the center of the lens 150 or a center axis 501.

The protruding portion 402 of the lens 150 may be disposed on the upper surface of the package body 110 and may be supported by the upper surface of the package body 110.

For example, the protruding portion 402 of the lens 150 may be disposed on the protrusion 140 of the package body 110 and may be supported by the protrusion 140 of the package body 110.

For example, the light generated from the light-emitting device 130 may be almost entirely incident on the incident surface 152 of the lens 150, and the light that has passed through the incident surface 152 may be distributed within a maximum angular range of about 60 degrees about the center axis 501, without being limited thereto.

In addition, for example, some of the light generated from the light-emitting device 130 may be incident on the inner surface 152a of the sidewall 401 of the lower end portion S1 of the lens 150, and the light that has been incident on the inner surface 152a may be almost entirely totally reflected by an outer circumferential surface 152b of the sidewall 401, without being limited thereto.

The light that has been totally reflected by the outer circumferential surface 152b of the sidewall 401 of the lower end portion S1 of the lens 150 may be emitted through the second portion 154b of the emitting surface 154 of the upper end portion S2 of the lens 150, and the light that has passed through the second portion 154b of the emitting surface 154 may be distributed within a range of more than 60 degrees about the center axis 501.

In addition, for example, since the first portion 154a of the emitting surface 154 is convex in the direction opposite the first direction 301, the first portion may serve to concentrate the light so that the light is distributed within a maximum angular range of 30 degrees about the center axis 501. In addition, for example, the second portion 154b of the emitting surface 154 may allow the light to be distributed within a range of more than about 30 degrees about the center axis 501.

The shapes of the lower end portion S1 and the upper end portion S2 of the lens 150 described in FIG. 4b are merely one embodiment of satisfying the relationship of the ratios of the angles of incidence $\theta1_e$, $\theta2_e$ and $\theta3_e$ and the angles of emission $\theta1_o$, $\theta2_o$, and $\theta3_o$ in the first to third planes V, H and α, which will be described below. That is, the shape of the lens 150 may be implemented in various forms so long as it satisfies the relationship of the ratios of the angles of incidence $\theta1_e$, $\theta2_e$, and $\theta3_e$ and the angles of emission $\theta1_o$, $\theta2_o$, and $\theta3_o$, which will be described below.

The center axis 501 of the lens 150 may be the axis that passes through the center of the lens 150 and is parallel to the first direction 301. The center axis 501 of the lens 150 may be aligned with the center of the light-emitting device 130.

For example, the center axis 501 of the lens 150 may be the axis that passes through the center 152-1 of the incident surface 152 and the center 154-1 of the emitting surface 154 and is parallel to the first direction 301. For example, the center axis 501 of the lens 150 may be perpendicular to the upper surfaces of the first and second conductive layers 122 and 124.

The first plane V may be the plane that passes through the center of the lens 150 or the center axis 501 and is parallel to the first direction 301.

The second plane H may be the plane that passes through the center of the lens 150 or the center axis 501, is parallel to the first direction 301, and is perpendicular to the first plane V.

The third plane α may be the plane that passes through the center of the lens 150 or the center axis 501, is parallel to the first direction 301, and is located between the first plane V and the second plane H. For example, the angle β between the first plane V and the third plane α may be a predetermined angle, and the predetermined angle may range from 30 degrees to 50 degrees. For example, the predetermined angle may be 45 degrees.

The reason why the predetermined angle β ranges from 30 degrees to 50 degrees is to make the shape of the lens 150 such that it has a beam pattern that may increase the illuminance of a first field (1.0 Field) α, which is parallel to the third plane α. This is because there is less effect of increasing the illuminance of the first field (1.0 Field) α, which is parallel to the third plane α, for example, when the predetermined angle β is below 30 degrees or above 50 degrees.

As will be described below in FIG. 9, when the ratio of horizontal and vertical lengths of a screen is about 4:3, the predetermined angle β relative to the second plane H may be about 37 degrees. In addition, when the ratio of horizontal and vertical lengths of a screen is about 5:3, the predetermined angle β may slightly exceed 30 degrees. In addition, when the ratio of horizontal and vertical lengths of a screen is about 1:1, the predetermined angle β may be about 45 degrees.

For example, each of the first plane V, the second plane H, and the third plane α may be perpendicular to the upper surfaces of the first and second conductive layers 122 and 124.

For example, in the xyz coordinate system, the center axis 501 of the lens 150 may correspond to the Z-axis, the first plane V may correspond to the xz plane, the second plane H may correspond to the yz plane, and the third plane α may be a plane that is located between the xz plane and the yz plane and is parallel to each of the xz plane and the yz plane. The first direction 301 may be the direction that is parallel to the Z-axis and faces the lower end portion S1 from the upper end portion S2.

The lens 150 is horizontally symmetrical about at least one of the first plane V and the second plane H.

For example, the lens 150 may be horizontally symmetrical about the first plane V.

Alternatively, for example, the lens 150 may be horizontally symmetrical about the second plane H. Alternatively, the lens 150 may be horizontally symmetrical about the first plane V and may also be horizontally symmetrical about the second plane H.

The shape of the lens 150 may be determined by the ratio of the angle at which the light generated from the light-emitting device 130 is incident on the incident surface 152 of the lower end portion S1 (e.g., $\theta 1_e$, $\theta 2_e$ and $\theta 3_e$)(hereinafter referred to as "the angle of incidence") and the angle at which the light that has been incident on the incident surface 152 is emitted from the emitting surface 154 of the upper end portion S2 (e.g., $\theta 1_o$, $\theta 2_o$ and $\theta 3_o$)(hereinafter referred to as "the angle of emission") with respect to each of the first to third planes V, H and α.

The angle of incidence of the lens 150 may be the tilt angle of light that is incident on the incident surface 152 of the lens 150 relative to the center axis 501 of the lens 150, and the angle of emission of the lens 150 may be the tilt angle of light that is emitted from the emitting surface 154 of the lens 150 relative to the center axis 501 of the lens 150 or an axis 501a that is parallel to the center axis 501.

Figure 5:
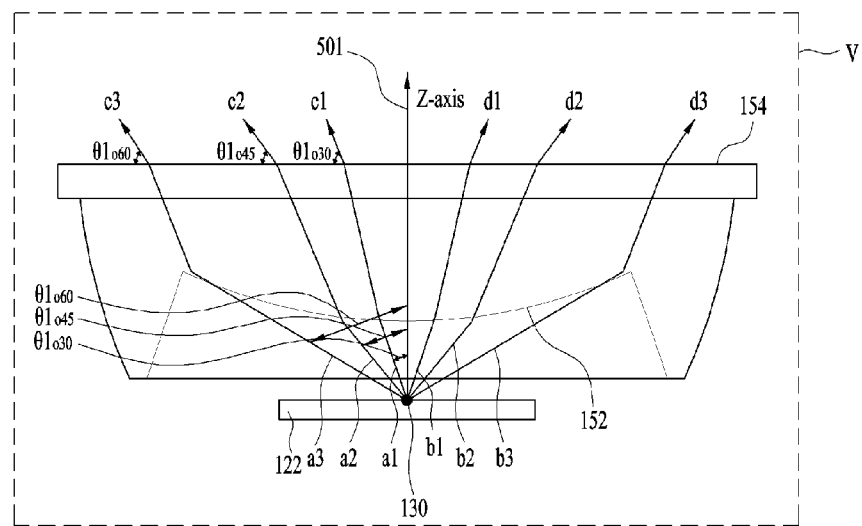
FIG. 5 illustrates the refraction of light in the first plane of the lens illustrated in FIG. 1.
Figure 6:
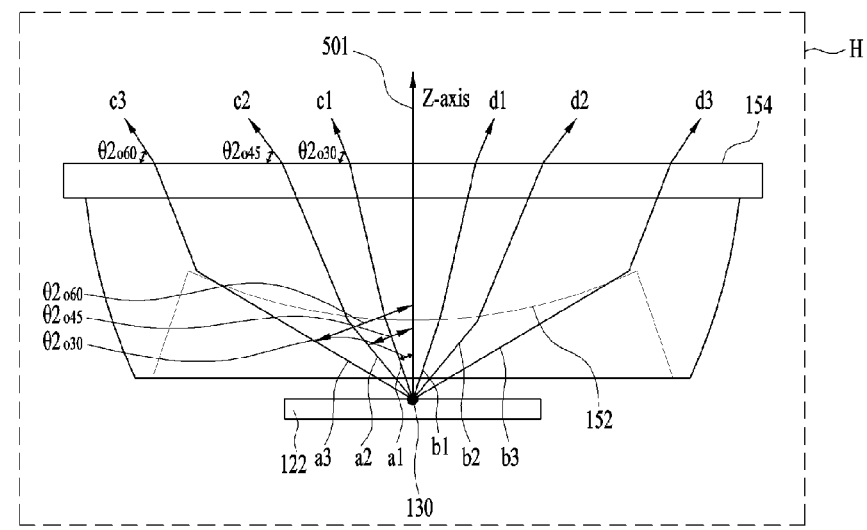
FIG. 6 illustrates the refraction of light in the second plane of the lens illustrated in FIG. 1.
Figures 7, 8:
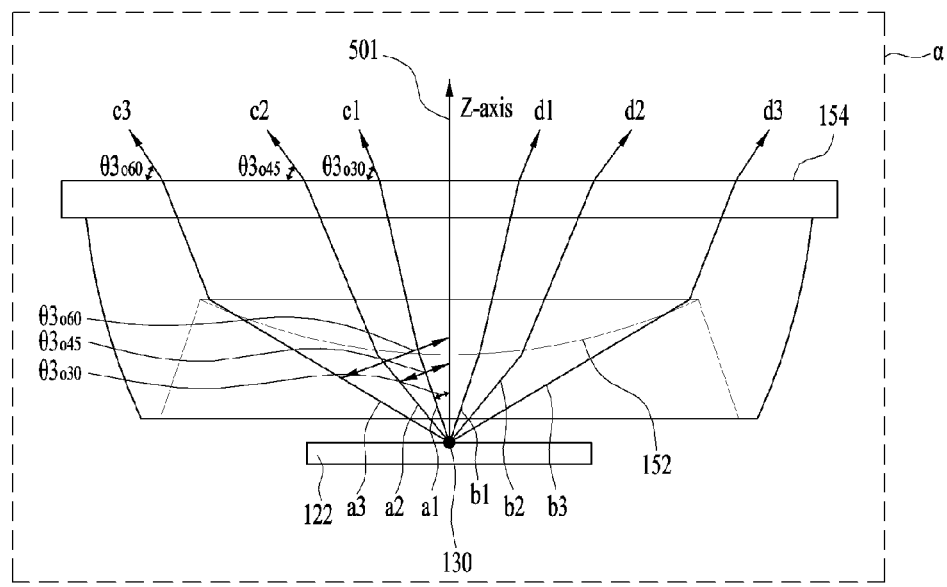
FIG. 7 illustrates the refraction of light in the third plane of the lens illustrated in FIG. 1.
FIG. 8 illustrates the angle of incidence and the angle of emission of light and the ratio of the angle of incidence and the angle of emission in each plane.

FIG. 5 illustrates the refraction of light in the first plane V of the lens 150 illustrated in FIG. 1, FIG. 6 illustrates the refraction of light in the second plane H of the lens 150 illustrated in FIG. 1, FIG. 7 illustrates the refraction of light in the third plane α of the lens 150 illustrated in FIG. 1, and FIG. 8 illustrates the angles of incidence $\theta 1_e$, $\theta 2_e$ and $\theta 3_e$, the angles of emission $\theta 1_o$, $\theta 2_o$ and $\theta 3_o$ of light and the ratios $\theta 1_o/\theta 1_e$, $\theta 2_o/\theta 2_e$, and $\theta 3_o/\theta 3_e$ of the angles of incidence $\theta 1_e$, $\theta 2_e$ and $\theta 3_e$ and the angles of emission $\theta 1_o$, $\theta 2_o$, and $\theta 3_o$ with respect to the respective planes.

In the respective planes V, H and α, incident light, which is emitted from the light-emitting device 130, may include first incident light a1, a2 and a3, which is emitted from one side (e.g., the left side) of the respective planes V, H and α about the center axis 501, and second incident light b1, b2 and b3, which is emitted from the other side (e.g., the right side) of the respective planes V, H and α.

In the respective planes V, H and α, emitted light, which is emitted from the lens 150, may include first emitted light c1, c2 and c3, which is emitted to one side (e.g., the left side) of the respective planes V, H and α about the center axis 501, and second emitted light d1, d2 and d3, which is emitted to the other side (e.g., the right side) of the respective planes V, H and α.

For example, the angles of incidence of the first incident light a1, a2 and a3 and the angles of emission of the first emitted light c1, c2 and c3 may be set to positive values, and the angles of incidence of the second incident light b1, b2 and b3 and the angles of emission of the second emitted light d1, d2 and d3 may be set to negative values.

Referring to FIGS. 5 to 8, at least one of the ratio $\theta 1_o/\theta 1_e$ of the angle of incidence $\theta 1_e$ and the angle of emission $\theta 1_o$ of light in the first plane V and the ratio $\theta 2_o/\theta 2_e$ of the angle of incidence $\theta 2_e$ and the angle of emission $\theta 2_o$ of light in the second plane H is smaller than the ratio $\theta 3_o/\theta 3_e$ of the angle of incidence $\theta 3_e$ and the angle of emission $\theta 3_o$ of light in the third plane α($\theta 1_o/\theta 1_e < \theta 3_o/\theta 3_e$ and/or $\theta 2_o/\theta 2_e < \theta 3_o/\theta 3_e$). The ratios of the angles of incidence and the angles of emission in the respective planes V, H and α may be the ratio of the absolute value of the angle of incidence and the absolute value of the angle of emission.

For example, based on the same angle of incidence in the first to third planes, the ratio $\theta 1_o/\theta 1_e$ of the angle of incidence $\theta 1_e$ and the angle of emission $\theta 1_o$ of light in the first plane V may be smaller than the ratio $\theta 3_o/\theta 3_e$ of the angle of incidence $\theta 3_e$ and the angle of emission $\theta 3_o$ of light in the third plane α. In the respective planes, the angles of incidence, which are the reference of comparison, are the same.

In addition, for example, based on the same angle of incidence in the first to third planes, the ratio $\theta 2_o/\theta 2_e$ of the angle of incidence $\theta 2_e$ and the angle of emission $\theta 2_o$ of light in the second plane H may be smaller than the ratio $\theta 3_o/\theta 3_e$ of the angle of incidence $\theta 3_e$ and the angle of emission $\theta 3_o$ of light in the third plane α.

For example, based on the same angle of incidence in the first to third planes, the ratio of the angle of incidence and the angle of emission of light in the third plane α may be greater than each of the ratio of the angle of incidence and the angle of emission of light in the first plane V and the ratio of the angle of incidence and the angle of emission of light in the second plane H.

Here, the angles of incidence $\theta 1_e$, $\theta 2_e$ and $\theta 3_e$ of the first to third planes V, H and α may be greater than 30 degrees and may be equal to or less than 60 degrees. This is because, among the light emitted from the light-emitting device 130, the angles of incidence $\theta 1_e$, $\theta 2_e$ and $\theta 3_e$ of light having a predetermined luminous flux or more that determines a light distribution pattern are greater than 30 degrees and equal to or less than 60 degrees.

That is, this is because, among the light that has an effect on the outer periphery of a beam pattern and is emitted from the light-emitting device 130, the range of the angle of incidence of available light that has the luminous intensity of 50% or more is greater than 30 degrees and equal to or less than 60 degrees.

For example, the angles of incidence $\theta 1_e$, $\theta 2_e$ and $\theta 3_e$ in the first to third planes V, H and α may be equal to or greater than 40 degrees, and may be equal to or less than 60 degrees.

For example, when the angles of incidence $\theta 1_e$, $\theta 2_e$ and $\theta 3_e$ in the first to third planes V, H and α range from degrees to 60 degrees, based on the same angle of incidence in the first to third planes, the ratio $\theta 1_o/\theta 1_e$ of the angle of incidence $\theta 1_e$ and the angle of emission $\theta 1_o$ of light in the first plane V and the ratio $\theta 2_o/\theta 2_e$ of the angle of incidence $\theta 2_e$ and the angle of emission $\theta 2_o$ of light in the second plane H may be smaller than the ratio $\theta 3_o/\theta 3_e$ of the angle of incidence $\theta 3_e$ and the angle of emission $\theta 3_o$ of light in the third plane α.

In addition, for example, the angles of incidence $\theta 1_e$, $\theta 2_e$ and $\theta 3_e$ of the first to third planes V, H and α may be 45 degrees or 60 degrees. For example, when the angle of incidence in each of the first to third planes is 45 degrees, the ratio (0.92, see FIG. 8) of the angle of emission to the angle of incidence (45 degrees) of light in the third plane α may be greater than the ratio (0.83) of the angle of emission to the angle of incidence (45 degrees) of light in the first plane V and the ratio (0.85) of the angle of emission to the angle of incidence (45 degrees) of light in the second plane H.

Since the lens 150 has a shape in which the ratio $\theta 1_o/\theta 1_e$ and $\theta 2_o/\theta 2_e$ of the angles of emission $\theta 1_o$ and $\theta 2_o$ to the angles of incidence $\theta 1_e$ and $\theta 2_e$ in the first plane V and the second plane H are smaller than the ratio $\theta 3_o/\theta 3_e$ of the angle of emission $\theta 3_o$ to the angle of incidence $\theta 3_e$ in the third plane α, the embodiment may mitigate a reduction in illuminance at the center of the lens 150 and may increase the illuminance in the diagonal direction of the lens 150, for example, in the third plane α.

Figures 9, 10:
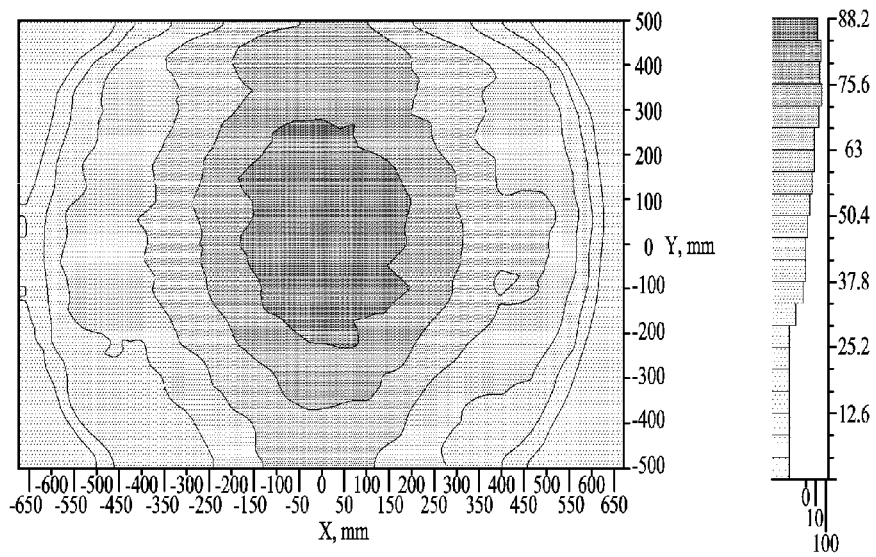
FIG. 9 illustrates a beam pattern measured by irradiating a screen with light emitted from the light-emitting device package according to the embodiment.
FIG. 10 illustrates the illuminance for each position on the screen of FIG. 9.

FIG. 9 illustrates a beam pattern measured by irradiating a screen with light emitted from the light-emitting device package 100 according to the embodiment, and FIG. 10 illustrates the illuminance for each position on the screen of FIG. 9. The distance between the light-emitting device package 100 and the screen is 1000 mm, the field of view (FOV) is 80, and the horizontal and vertical lengths of the screen are 1342,559 mm×1006.92 mm. The screen may be divided into a plurality of fields having predetermined areas, as illustrated in FIG. 9.

For example, the field that is close to four corners of the screen may be defined as a 1 field (1.0 F), the center of the screen may be defined as a 0.1 field, and the space therebetween may be divided into a plurality of fields.

Referring to FIGS. 9 and 10, the field located at the center of the screen may correspond to the center of the lens 150, first fields aligned with the vertical line that passes through the center of the screen may correspond to the first plane V of the lens 150, second fields aligned with the horizontal line that passes through the center of the screen may correspond to the second plane H of the lens 150, and third fields located between the first fields and the second fields may correspond to the third plane α of the lens 150.

It can be seen that the illuminance at the center of the screen is 87.64 [Lux] and the illuminance of the first field (1.0 F) of the screen is 30% of the illuminance at the center of the screen. The embodiment may increase the illuminance in a direction that is parallel to the third plane α of the lens 150 so that the illuminance in the diagonal direction, i.e. the direction parallel to the third plane α of the lens 150, is 30% or more of the illuminance at the center of the screen.

Figures 11, 12:
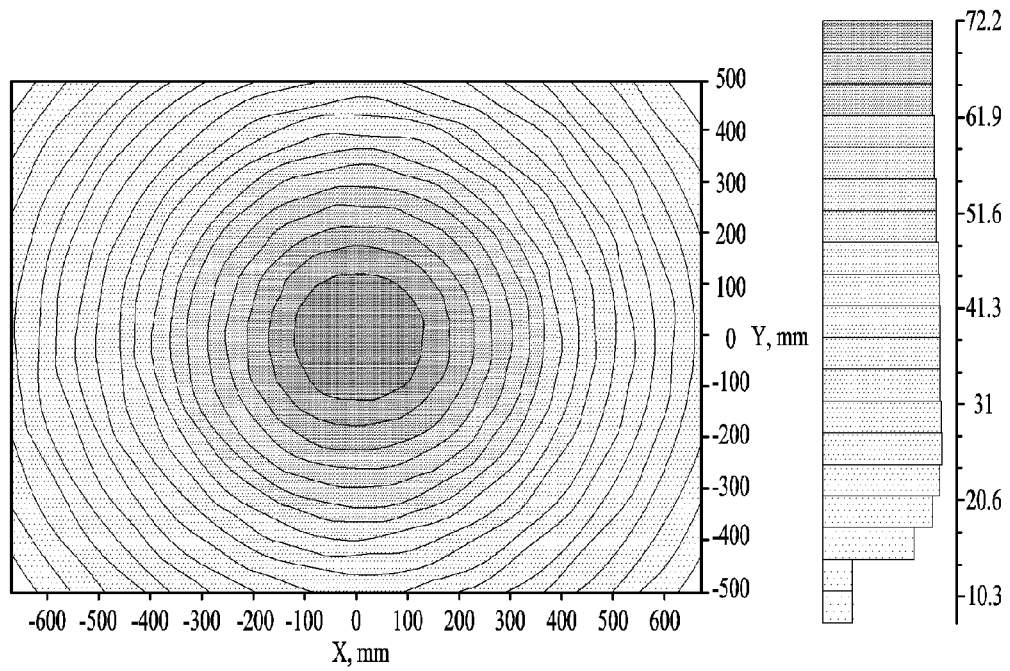
FIG. 11 illustrates a beam pattern measured by irradiating a screen with light emitted from a light-emitting device package in which a general symmetrical lens is mounted.
FIG. 12 illustrates the illuminance on a center field of the screen of FIG. 11 and the illuminance of a first field that is parallel to each plane.
Figures 13, 14:
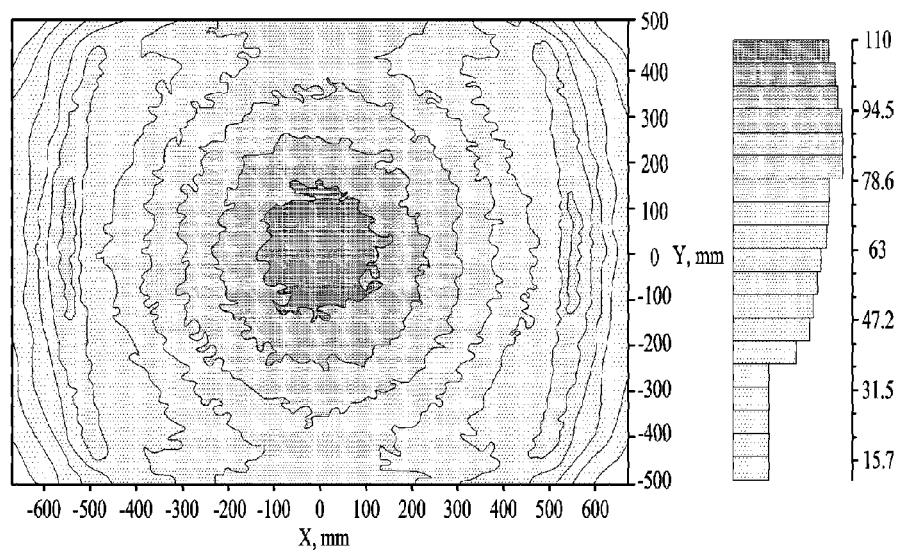
FIG. 13 illustrates a beam pattern measured by irradiating a screen with light emitted from the light-emitting device package according to the embodiment.
FIG. 14 illustrates the illuminance on a center field of the screen of FIG. 12 and the illuminance of the first field that is parallel to each plane.

FIG. 11 illustrates a beam pattern measured by irradiating a screen with light emitted from a light-emitting device package in which a general symmetrical lens is mounted, and FIG. 12 illustrates the illuminance on a center field of the screen of FIG. 11 and the illuminance of the first field that is parallel to each plane, FIG. 13 illustrates a beam pattern measured by irradiating a screen with light emitted from the light-emitting device package 100 according to the embodiment, and FIG. 14 illustrates the illuminance on a center field of the screen of FIG. 12 and the illuminance of a first field that is parallel to each plane.

In FIGS. 11 and 13, the distance between the light-emitting device package 100 and the screen is 1000 mm, the field of view (FOV) is 80, and the horizontal and vertical lengths of the screen are 1335 mm×1001 mm. In addition, the other components of the light-emitting device package excluding the lens are identical to those in FIGS. 11 to 13.

Referring to FIGS. 11 and 12, the illuminance at the center of the screen is 72.05 [Lux], the illuminance of the first field (1.0 Field (V)) parallel to the first plane V is 35.97 [Lux], the illuminance of the first field (1.0 Field (H)) parallel to the second plane H is 23.69 [Lux], and the illuminance of the first field (1.0 Field (α)) parallel to the third plane α is 27.14 [Lux]. In addition, the intensities of illumination of the first fields (1.0 Field (V), 1.0 Field (H) and 1.0 Field (α)) parallel to the respective planes V, H and α may be 30% or more of the illuminance at the center field of the screen.

Referring to FIGS. 13 and 14, the illuminance at the center of the screen is 108.82.05 [Lux], the illuminance of the first field (1.0 Field (V)) parallel to the first plane V is 95.27 [Lux], the illuminance of the first field (1.0 Field (H)) parallel to the second plane H is 67.41 [Lux], and the illuminance of the first field (1.0 Field (α)) parallel to the third plane α is 40.31 [Lux]. In addition, the intensities of illumination of the first fields (1.0 Field (V), 1.0 Field (H) and 1.0 Field (α)) parallel to the respective planes V, H and α may be 30% or more of the illuminance at the center field of the screen.

All of the intensities of illumination of the first fields (1.0 Field (V), 1.0 Field (H) and 1.0 Field (α)) parallel to the respective planes V, H and α in FIGS. 11 and 12 and the intensities of illumination of the first fields (1.0 Field (V), 1.0 Field (H) and 1.0 Field (α)) parallel to the respective planes V, H and α in FIGS. 13 and 14 are 30% or more of the illuminance at the center field of the screen. However, it can be seen that the illuminance at the center field in FIGS. 11 and 12 is reduced by 36.77 [Lux] compared to the illuminance at the center field in FIGS. 13 and 14.

That is, it can be seen that, in FIGS. 11 and 12, the intensities of illumination of the first fields (1.0 Field (V), 1.0 Field (H) and 1.0 Field (α)) may be increased to be 30% or more of the illuminance at the center field, whereas the illuminance at the center field is greatly reduced. In FIGS. 13 and 14, the intensities of illumination of the first fields (1.0 Field (V), 1.0 Field (H) and 1.0 Field (α)) may be increased to be 30% or more of the illuminance at the center field, and a reduction in illuminance at the center field may be mitigated, whereby the uniformity of the entire illuminance may be improved.

The features, structures, effects and the like described above are included in at least one embodiment and is not necessary to be limited to only one embodiment. In addition, the features, structures, effects and the like described in each embodiment may be combined or modified in other embodiments by those who skilled in the art. Thus, descriptions related to these combinations and modifications should be construed as belonging to the scope of the disclosure.

INDUSTRIAL APPLICABILITY

The lens may be used in, for example, a light-emitting device package, a lighting apparatus, a display apparatus, and a headlamp.

The invention claimed is:

1. A lens, comprising:
a lower end portion including an incident surface which is convex in a first direction and a sidewall which surrounds the incident surface and protrudes in the first direction from the incident surface; and
an upper end portion including a first portion corresponding to the incident surface and a second portion locating around the first portion and corresponding to the sidewall of the lower end portion,
wherein the second portion is an inclined surface tilted downward from an edge of the upper end portion toward a center of the upper end portion,
wherein based on the same angle of incidence in the first to third planes, the ratio of the angle of incidence and the angle of emission in the third plane is greater than the ratio of the angle of incidence and the angle of emission in the first plane and the ratio of the angle of incidence and the angle of emission in the second plane,
wherein the angle of incidence is an angle of light that is incident on the incident surface relative to a center axis,
wherein the angle of emission is an angle of light that is emitted from the emitting surface relative to the center axis,
wherein the same angle of incidence is greater than 30 degrees and equal to or less than 60 degrees,
wherein the first plane and the third plane form an angle within a range from 30 degrees to 50 degrees therebetween, and
wherein each of the first to third planes is a plane that passes through the center axis and is parallel to a first direction, the first plane is perpendicular to the second plane, the third plane is located between the first plane and the second plane, the center axis passes through a center of the lens and is parallel to the first direction, and the first direction is a direction that faces the lower end portion from the upper end portion.

2. The lens according to claim 1, wherein the same angle of incidence in the first to third planes is equal to or greater than 40 degrees and equal to or less than 60 degrees.

3. The lens according to claim 1, wherein the lens is horizontally symmetrical about the first plane.

4. The lens according to claim 1, wherein the lens is horizontally symmetrical about the second plane.

5. The lens according to claim 1, wherein the lens is horizontally symmetrical about the first plane and also horizontally symmetrical about the second plane.

6. The lens according to claim 1, wherein the center axis is an axis that passes through a center of the incident surface and a center of the emitting surface.

7. A lens, comprising:
a lower end portion having an incident surface on which light is incident;
an upper end portion having an emitting surface through which the light that has passed through the incident surface passes,
wherein the lower end surface has a shape which is convex in a first direction and includes a recess indented in a center thereof in a direction opposite the first direction and a sidewall located to surround the recess,
wherein the incident surface includes a lower surface of the recess and a side surface of the recess, an upper end portion including a first portion corresponding to the incident surface and a second portion locating around the first portion and corresponding to the sidewall of the lower end portion,
wherein the second portion is an inclined surface tilted downward from an edge of the upper end portion toward a center of the upper end portion,
wherein based on the same angle of incidence in the first to third planes, the ratio of the angle of incidence and the angle of emission in the third plane is greater than the ratio of the angle of incidence and the angle of emission in the first plane and the ratio of the angle of incidence and the angle of emission in the second plane,
wherein the angle of incidence is an angle of light that is incident on the incident surface relative to a center axis, and the angle of emission is an angle of light that is emitted from the emitting surface relative to the center axis,
wherein the same angle of incidence is greater than 30 degrees and equal to or less than 60 degrees,
wherein the first plane and the third plane form an angle within a range from 30 degrees to 50 degrees therebetween, and
wherein, in a xyz coordinate system, the center axis corresponds to a z-axis, the first plane corresponds to an xz plane, the second plane corresponds to an yz plane, the third plane is located between the first plane and the second plane and is parallel to the first and second planes, and the first direction is a direction that faces the lower end portion from the upper end portion.

8. The lens according to claim 7, wherein the lower surface of the recess is a curved surface that is convex in the first direction.

9. The lens according to claim 7, wherein the lower end portion has a lowermost end located lower than a center of the incident surface.

10. The lens according to claim 7, wherein a distance from a center of the emitting surface to a center of the incident surface is shorter than a distance from the center of the emitting surface to a lowermost end of the sidewall.

11. The lens according to claim 7, wherein the first portion is convex in a direction opposite the first direction.

12. The lens according to claim 7, wherein the upper end portion has a protruding portion configured to protrude in a second direction from a side surface of the lower end portion, and the second direction is perpendicular to the first direction.

13. The lens according to claim 7, wherein the first portion has a center aligned with a center of the incident surface.

14. A light-emitting device package comprising:
a package body;
first and second conductive layers disposed on the package body;
a light-emitting device electrically connected to the first and second conductive layers; and
a lens disposed on the package body and configured to refract light generated from the light-emitting device according to claim 1.

15. The lens according to claim 7, wherein the same angle of incidence in the first to third planes is equal to or greater than 40 degrees and equal to or less than 60 degrees.

16. The lens according to claim 1, wherein the first plane and the third plane form an angle of 45 degrees therebetween.

17. The lens according to claim 7, wherein the first plane and the third plane form an angle of 45 degrees therebetween.

18. The lens according to claim 1, wherein the second portion overlaps the sidewall of the lower end portion in the first direction.

19. The lens according to claim 7, wherein the second portion overlaps the sidewall of the lower end portion in the first direction.

20. The lens according to claim 7, wherein a diameter of the first portion is greater than a diameter of the lower surface of the recess.

* * * * *